(12) United States Patent
Lee et al.

(10) Patent No.: US 11,096,319 B2
(45) Date of Patent: Aug. 17, 2021

(54) METHOD OF MANUFACTURING ELECTRONIC DEVICE USING LARGE-SCALE TRANSFERRING METHOD

(71) Applicant: EWHA UNIVERSITY-INDUSTRY COLLABORATION FOUNDATION, Seoul (KR)

(72) Inventors: Sang Wook Lee, Seoul (KR); Dong Hoon Shin, Gyeonggi-do (KR)

(73) Assignee: EWHA UNIVERSITY-INDUSTRY COLLABORATION FOUNDATION, Seoul (KR)

(*) Notice: Subject to any disclaimer, the term of this patent is extended or adjusted under 35 U.S.C. 154(b) by 437 days.

(21) Appl. No.: 15/944,445

(22) Filed: Apr. 3, 2018

(65) Prior Publication Data

US 2018/0288910 A1  Oct. 4, 2018

(30) Foreign Application Priority Data

Apr. 3, 2017  (KR) .......................... 10-2017-0043090

(51) Int. Cl.
| | | |
|---|---|---|
| *H01S 4/00* | (2006.01) | |
| *H05K 13/00* | (2006.01) | |
| *H01L 21/683* | (2006.01) | |
| *H01L 23/544* | (2006.01) | |

(52) U.S. Cl.
CPC ..... *H05K 13/0015* (2013.01); *H01L 21/6835* (2013.01); *H01L 23/544* (2013.01); *H05K 13/00* (2013.01); *H01L 2221/6835* (2013.01); *H01L 2221/68354* (2013.01); *H01L 2223/54426* (2013.01)

(58) Field of Classification Search
CPC ............... H01L 21/6835; H01L 23/544; H01L 2221/68354; H01L 2223/54426; H05K 13/00; H05K 13/0015
See application file for complete search history.

(56) References Cited

U.S. PATENT DOCUMENTS

| | | | |
|---|---|---|---|
| 6,575,821 B2* | 6/2003 | Jost .......................... | B24B 55/08 451/526 |
| 9,995,662 B2* | 6/2018 | Husain ................ | B01L 3/50857 |
| 2019/0305319 A1* | 10/2019 | Liang .................... | H01M 4/663 |

FOREIGN PATENT DOCUMENTS

| | | |
|---|---|---|
| JP | 2001-162703 A | 6/2001 |
| KR | 10-2009-0107221 A | 10/2009 |
| KR | 10-2012-0078875 A | 7/2012 |
| KR | 10-2014-0031008 A | 3/2014 |
| KR | 10-2016-0089529 A | 7/2016 |

* cited by examiner

*Primary Examiner* — Paul D Kim
(74) *Attorney, Agent, or Firm* — Burris Law, PLLC

(57) ABSTRACT

A method of manufacturing an electronic device is provided to realize efficient large-scale transferring. The method includes locating a transfer film over a plurality of functional layers separated from each other over a source substrate; attaching a support frame to the transfer film, the support frame having a plurality of holes spaced apart from each other; removing the source substrate from the transfer film, with the plurality of functional layers being in close contact with a bottom surface of the transfer film; locating the transfer film over a target substrate, with the plurality of functional layers being in close contact with the bottom surface of the transfer film; detaching the support frame from the transfer film; and removing the transfer film from the target substrate.

16 Claims, 7 Drawing Sheets

METHOD OF MANUFACTURING ELECTRONIC DEVICE USING LARGE-SCALE TRANSFERRING METHOD

CROSS-REFERENCE TO RELATED APPLICATION

This application claims the benefit of Korean Patent Application No. 10-2017-0043090, filed on Apr. 3, 2017, in the Korean Intellectual Property Office, the disclosure of which is incorporated herein in its entirety by reference.

BACKGROUND

1. Field

One or more embodiments relate to a method of manufacturing an electronic device, and more particularly, to a method of manufacturing an electronic device using a large-scale transferring method to enable efficient large-scale transferring.

2. Related Art

A particular film is usually formed in manufacturing an electronic device. The particular film may be directly formed on a substrate which will be an element of the electronic device. Occasionally, a film may be formed on a support and then transferred to the substrate to form the particular film.

However, according to the related art, it is impossible to transfer a large-scale film at a time.

SUMMARY

One or more embodiments include a method of manufacturing an electronic device, thereby enabling efficient large-scale transferring.

Additional aspects will be set forth in part in the description which follows and, in part, will be apparent from the description, or may be learned by practice of the presented embodiments.

According to one or more embodiments, a method of manufacturing an electronic device includes locating a transfer film over a plurality of functional layers, the plurality of functional layers being separated from each other over a source substrate; attaching a support frame to the transfer film, the support frame having a plurality of holes spaced apart from each other; removing the source substrate from the transfer film, with the plurality of functional layers being in close contact with a bottom surface of the transfer film; locating the transfer film over a target substrate, with the plurality of functional layers being in close contact with the bottom surface of the transfer film; detaching the support frame from the transfer film; and removing the transfer film from the target substrate.

Adhesiveness of the support frame may vary with temperature.

In detail, the detaching of the support frame may include decreasing the adhesiveness of the support frame by increasing temperature.

The detaching of the support frame may include decreasing the adhesiveness of the support frame by increasing temperature to 150° C. to 180° C.

Alternatively, the adhesiveness of the support frame may be decreased when ultraviolet rays are radiated onto the support frame, and the detaching of the support frame may include decreasing the adhesiveness of the support frame by radiating the ultraviolet rays onto the support frame.

An area of the support frame may be larger than an area of the transfer film.

The support frame may have the plurality of holes throughout an area wider than a portion of the transfer film corresponding to the plurality of functional layers.

The plurality of holes of the support frame may be uniformly distributed.

The plurality of functional layers may include a one-dimensional micro-material layer or a one-dimensional nano-material layer having a tube shape, a wire shape, or a bar shape; or a two-dimensional micro-material layer or a two-dimensional nano-material layer including one among graphene, transition metal dichalcogenide, hexagonal boron nitride, and black phosphorus.

The transfer film may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), poly(vinyl acetate) (PVAc), silica-gel, or polyurethane acrylate (PUA).

According to one or more embodiments, a method of manufacturing an electronic device includes locating a transfer film over a plurality of functional layers separated from each other over a source substrate; attaching a support frame to the transfer film, the support frame having a plurality of holes spaced apart from each other; removing the source substrate from the transfer film, with the plurality of functional layers being in close contact with a bottom surface of the transfer film; locating the transfer film over a target substrate, with the plurality of functional layers being in close contact with the bottom surface of the transfer film; and detaching or removing the transfer film from the target substrate so that the support frame is detached from the target substrate.

An area of the support frame may be larger than an area of the transfer film.

The support frame may have the plurality of holes throughout an area wider than a portion of the transfer film corresponding to the plurality of functional layers.

The plurality of holes of the support frame may be uniformly distributed.

The plurality of functional layers may include a one-dimensional micro-material layer or a one-dimensional nano-material layer having a tube shape, a wire shape, or a bar shape; or a two-dimensional micro-material layer or a two-dimensional nano-material layer including one among graphene, transition metal dichalcogenide, hexagonal boron nitride, and black phosphorus.

The transfer film may include PDMS, CYTOP, PMMA, ethyl lactate, PC, PPC, PI, para-aramid fibrid, PET, PVC, PVAc, silica-gel, or PUA.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
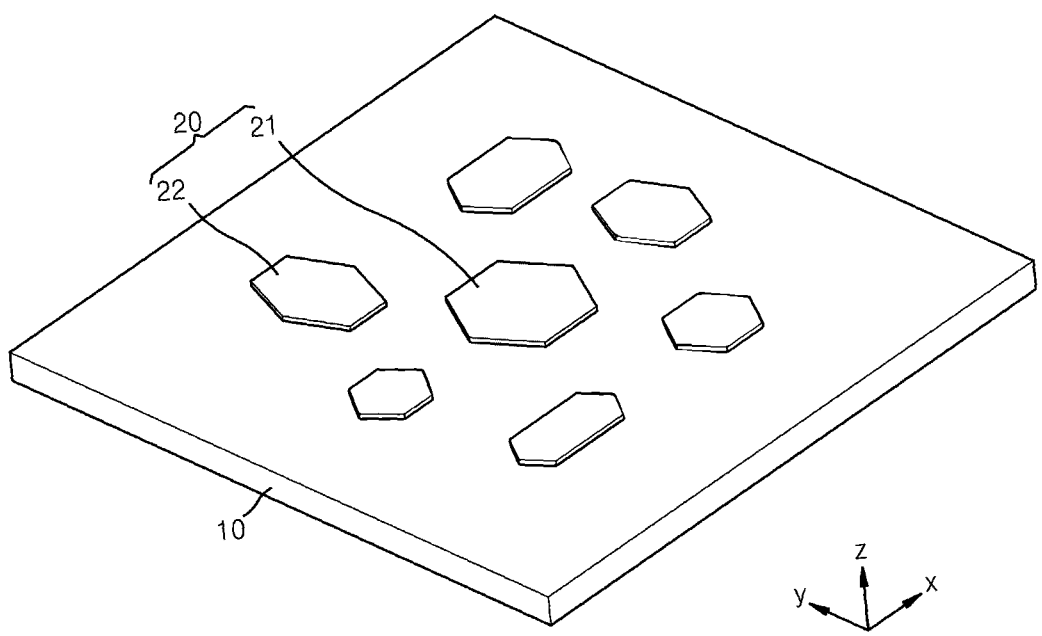
FIGS. 1 through 7 are schematic perspective views of stages in a method of manufacturing an electronic device, according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element such as a layer, a film, a region, a plate, or the like is referred to as being "on" another element, it can be directly on the other element, or intervening elements may also be present. In the drawings, the size of elements may be exaggerated or reduced for clarity. For example, the size and thickness of elements are arbitrarily illustrated in the drawings for convenience's sake, and thus the embodiments are not limited to the drawings.

As used herein, the term "and/or" includes any and all combinations of one or more of the associated listed items. Expressions such as "at least one of," when preceding a list of elements, modify the entire list of elements and do not modify the individual elements of the list.

Hereinafter, x, y and z axes may not be limited to three axes in a rectangular coordinates system but may be interpreted in a wider sense including them. For example, the x, y and z axes may be orthogonal or may indicate different directions which are not orthogonal.

FIGS. 1 through 7 are schematic perspective views of stages in a method of manufacturing an electronic device, according to one or more embodiments.

A plurality of functional layers 20 is prepared. The functional layers 20 may be prepared over a source substrate 10 such as silicon oxide or a wafer. The functional layers 20 may be prepared without being patterned and then processed into a predetermined form according to necessity.

For example, the functional layers 20 may be graphene. In this case, a graphene film, which has not been patterned, may be formed or located over the source substrate 10 and then patterned to have a desired shape and/or size using electron-beam lithography and/or $O_2$ plasma process, so that the functional layers 20 including a first functional layer 21 and a second functional layer 22, as shown in FIG. 1, may be formed.

The functional layers 20 are not limited to graphene and may include organic semiconductor material, carbon nanotube, or transition metal dichalcogenide. For example, the functional layers 21 and 22 may include a one-dimensional micro- or nano-material layer having a tube, wire or bar shape. Alternatively, the functional layers 21 and 22 may include a two-dimensional micro- or nano-material layer including graphene, transition metal dichalcogenide, hexagonal boron nitride, or black phosphorus. These facts apply to embodiments and modifications set forth below.

Figure 2:
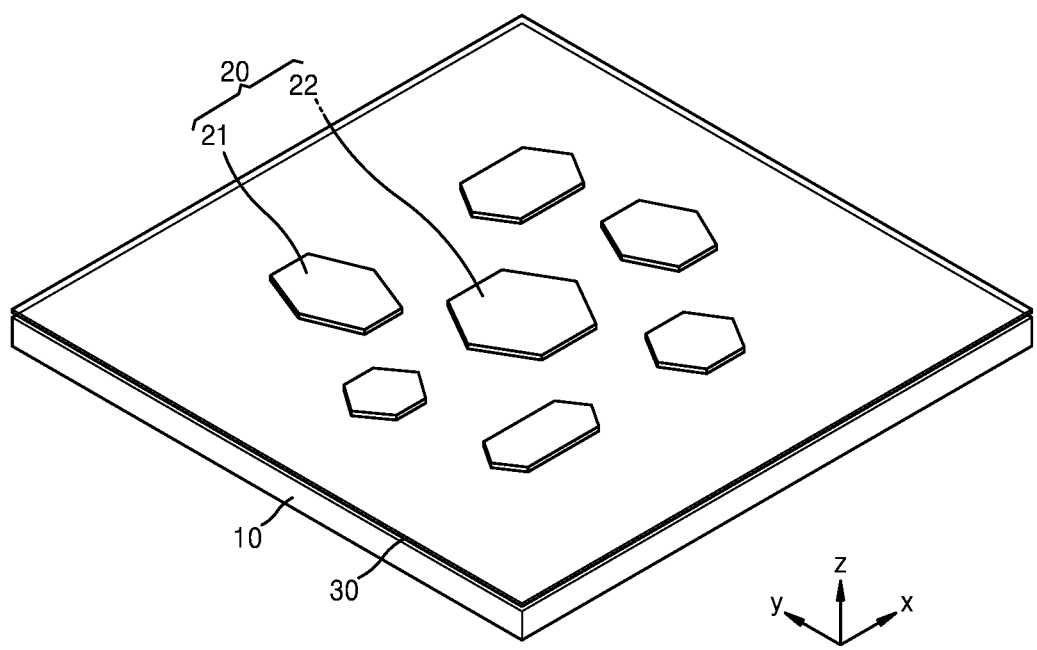

Thereafter, as shown in FIG. 2, a transfer film 30 is located over the source substrate 10. In detail, the transfer film 30 is located over the functional layers 20. The functional layers 20 are separated from one another. The transfer film 30 may include polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), poly(vinyl acetate) (PVAc), silica-gel, or polyurethane acrylate (PUA).

The transfer film 30 may be obtained by forming the transfer film 30 on a separate support using spin coating or the like and separating the transfer film 30 from the support. The transfer film 30 may be bonded to at least one of the functional layers 20 and used to transfer the at least one of the functional layers 20. Alternatively, the transfer film 30, instead of being formed on the separate support, may be directly formed on the source substrate 10 using spin coating or the like to cover the functional layers 20.

Figure 3:
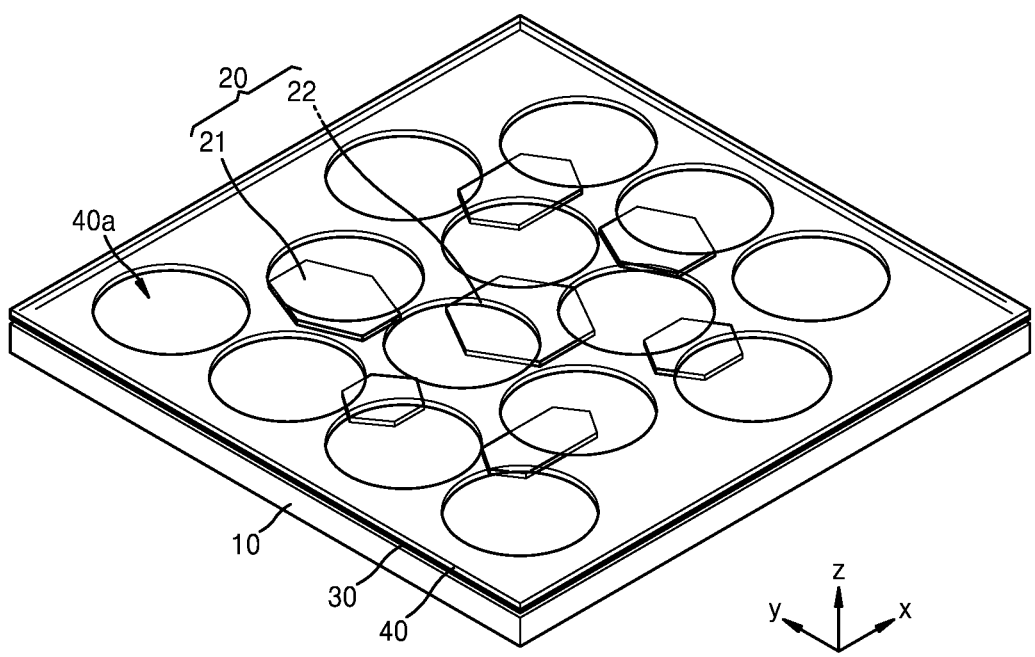

Subsequently, as shown in FIG. 3, a support frame 40 having a plurality of holes 40a spaced apart from one another is attached to the transfer film 30. The support frame 40 may function to enhance convenience in handling during a succeeding transfer procedure described below. The support frame 40 may include, for example, thermal release adhesive tape or ultraviolet (UV) release adhesive tape.

Figure 4:
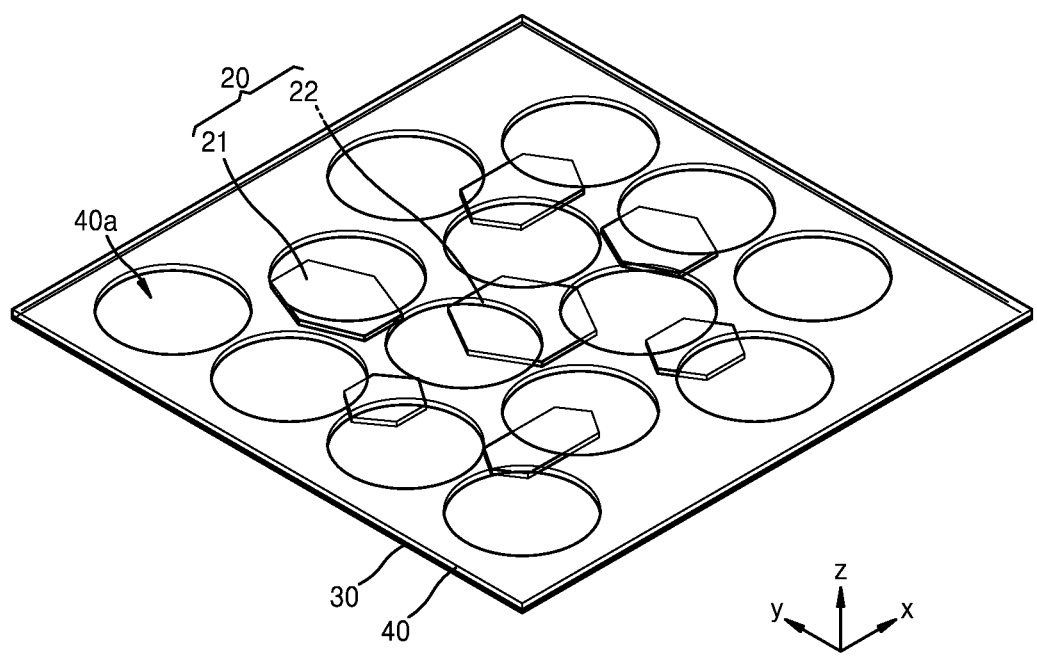

Subsequently, the source substrate 10 is removed from the transfer film 30 with the functional layers 20 in close contact with a bottom surface of the transfer film 30 in a z-direction, as shown in FIG. 4. Various methods may be used to remove the source substrate 10 from the transfer film 30. For example, when the source substrate 10 includes silicon oxide or silicon, the source substrate 10 may be immersed in liquid which dissolves silicon oxide or silicon. The liquid may be a potassium hydroxide solution, a sodium hydroxide solution, or a hydrogen fluoride solution. The source substrate 10 is immersed in the liquid in a state where the transfer film 30 and the support frame 40 have been formed, so that the source substrate 10 is removed from the transfer film 30.

When the source substrate 10 including silicon oxide or silicon is immersed in the liquid that dissolves silicon oxide or silicon, all of the source substrate 10 is not dissolved completely. For example, the liquid may permeate the side of the source substrate 10 at an interface between the source substrate 10 and the transfer film 30, so that the transfer film 30 may be gradually detached from the source substrate 10.

The functional layers 20 may be detached from the source substrate 10 together with the transfer film 30 in a state where the functional layers 20 are fixed to the bottom surface of the transfer film 30 in the z-direction. If needed, the functional layers 20, the transfer film 30, and/or the support frame 40 may be immersed in ultra pure water after being detached from the source substrate 10, so that the functional layers 20, the transfer film 30, and/or the support frame 40 may undergo a cleaning process such as removing liquid such as a potassium hydroxide solution remaining therein.

Figure 5:
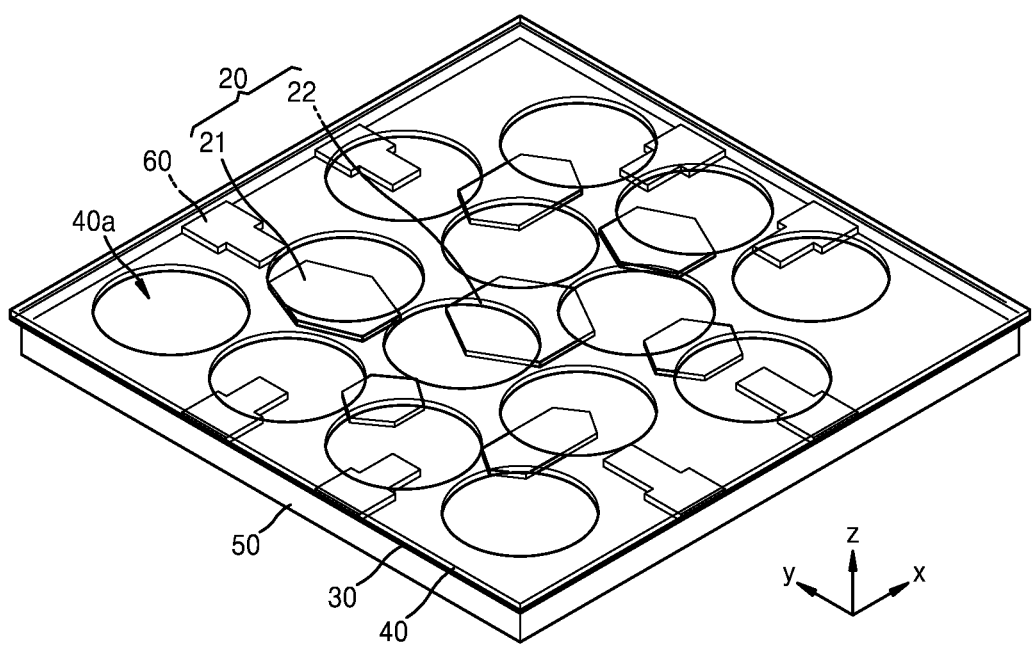

After the functional layers 20, the transfer film 30, and the support frame 40 are detached from the source substrate 10, the functional layers 20, the transfer film 30, and the support frame 40 are located over a target substrate 50, as shown in FIG. 5. At this time, the functional layers 20 and the target substrate 50 need to be aligned by adjusting the relative positions thereof. As described above, since the support frame 40 has a plurality of the holes 40a, the relative positions of the target substrate 50 and the functional layers 20 at the bottom of the transfer film 30 are clearly checked through the holes 40a, so that predetermined relative alignment may be correctly performed. For example, the relative alignment between the functional layers 20 and a wiring 60 may be correctly performed by observing the functional layers 20 at the bottom of the transfer film 30 and the wiring 60 over the target substrate 50 through the holes 40a of the support frame 40.

Since the transfer film 30 is transparent or translucent, it does not trouble the alignment. Instead of the wiring 60 over the target substrate 50, alignment marks (not shown) on the target substrate 50 may be observed through the holes 40a of the support frame 40 to correctly perform the relative alignment between the functional layers 20 and the wiring 60.

After the functional layers 20, the transfer film 30, and the support frame 40 are aligned with the target substrate 50, the functional layers 20 are attached to the target substrate 50. Here, attaching the functional layers 20 to the target substrate 50 may be considered, not as adding an adhesive between the functional layers 20 and the target substrate 50, but as locating the functional layers 20 to be in surface contact with the target substrate 50. Accordingly, the functional layers 20 may adhere to the target substrate 50 due to van der Waals forces or the like between the functional layers 20 and the target substrate 50.

Figure 6:
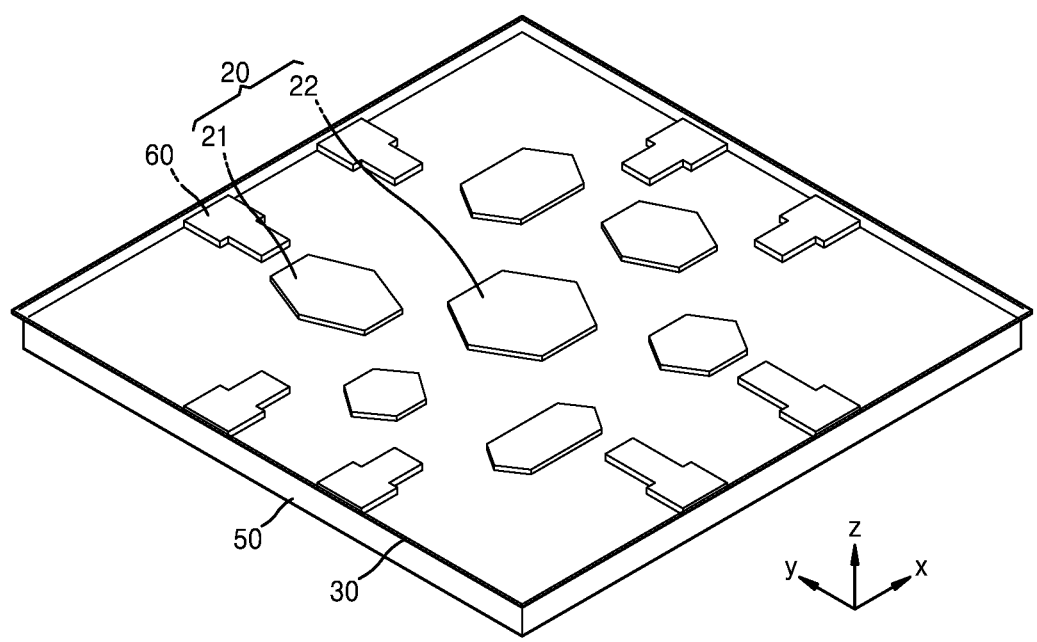

Subsequently, as shown in FIG. 6, the support frame 40 is detached from the transfer film 30. Mechanical exfoliation may be used to detach the support frame 40 from the transfer film 30. When the support frame 40 is detached from the transfer film 30, stress may be applied to the functional layers 20 at the bottom of the transfer film 30 due to adhesion between the support frame 40 and the transfer film 30. In this case, the functional layers 20 may be damaged. However, according to the current embodiments, the support frame 40 has a plurality of the holes 40a, and therefore, the overlapping area between the support frame 40 and the transfer film 30 may be reduced. This means that the overlapping area between the support frame 40 and the functional layers 20 may be reduced. As a result, an area of the functional layers 20 that are under stress may be reduced when the support frame 40 is detached from the transfer film 30.

It may be considered that the support frame 40 has a single large hole corresponding to all of the functional layers 20. However, when a plurality of the functional layers 20 are transferred to a large area, the size of the single hole may be excessively large. As a result, the overall mechanical strength of the support frame 40 may be decreased. In this case, when the source substrate 10 has been removed from the transfer film 30 as shown in FIG. 4, handling the transfer film 30 is not easy. However, according to the current embodiments, the support frame 40 has a plurality of the holes 40a, and therefore, the overall mechanical strength of the support frame 40 may be maintained. Therefore, there may be no problem in handling the transfer film 30 after the source substrate 10 is removed from the transfer film 30 as shown in FIG. 4.

Figure 7:
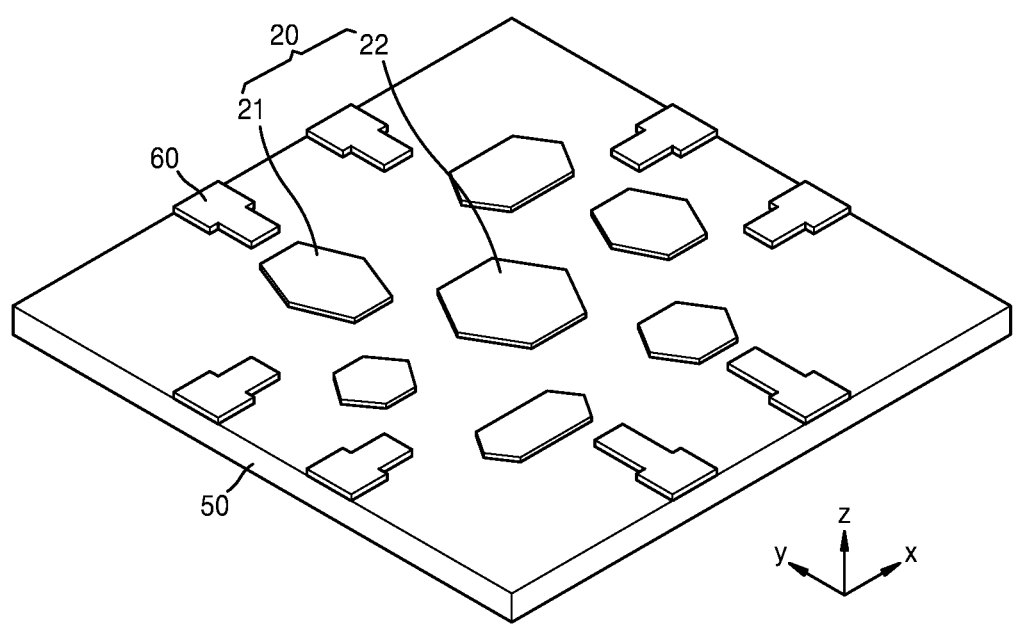

Thereafter, an electronic device may be manufactured by removing the transfer film 30, as shown in FIG. 7. The transfer film 30 may be removed using a common stripper. For example, the transfer film 30 including PMMA may be removed using acetone or chloroform.

Meanwhile, the support frame 40 may have adhesiveness. In particular, the adhesiveness of the support frame 40 may vary with temperature. In this case, the support frame 40 may be a release tape and may include, for example, thermal expendable acrylic adhesive, terpene-phenolic tackifying resin, and/or rosin-phenolic tackifying resin. In this case, the support frame 40 may be detached from the transfer film 30, as shown in FIG. 6, by decreasing the adhesiveness of the support frame 40 by increasing temperature. For example, the adhesiveness of the support frame 40 may be decreased by increasing temperature to 150° C. to 180° C., so that the support frame 40 may be detached from the transfer film 30. At this time, the support frame 40 is not completely detached from the transfer film 30, and therefore, mechanical exfoliation is used to completely detach the support frame 40 from the transfer film 30.

Alternatively, the adhesiveness of the support frame 40 may be decreased by radiating UV rays at the support frame 40. At this time, the support frame 40 may include, for example, acrylic resin adhesive, oligomer, reactive monomer, photoinitiator, or photoadditive. In this case, the support frame 40 may be detached from the transfer film 30, as shown in FIG. 6, by decreasing the adhesiveness of the support frame 40 by radiating UV rays at the support frame 40. At this time, the support frame 40 is not completely detached from the transfer film 30, and therefore, mechanical exfoliation is used to completely detach the support frame 40 from the transfer film 30.

That the support frame 40 has adhesiveness may be considered as the support frame 40 including a base film and an adhesive layer on the base film when necessary.

Although it is illustrated in FIGS. 3 through 5 that the area of the support frame 40 is equal to the area of the transfer film 30, it is just for convenience's sake. Since the support frame 40 is eventually detached from the transfer film 30, as described above, the area of the support frame 40 may be greater than the area of the transfer film 30. In this case, when the support frame 40 is detached from the transfer film 30 as shown in FIG. 6, a portion of the support frame 40 sticking out of the transfer film 30 may be held by a worker's hand or tool, so that the support frame 40 may be easily detached from the transfer film 30.

As shown in FIGS. 3 through 5, the support frame 40 may have the holes 40a throughout an area wider than a portion of the transfer film 30 corresponding to the functional layers 20. The support frame 40 has a plurality of the holes 40a to minimize an area of the functional layers 20 that are under stress when the support frame 40 is detached from the transfer film 30, as described above. Portions of the functional layers 20 overlapping the support frame 40 may be under stress. Accordingly, when the support frame 40 has a plurality of the holes 40a throughout an area wider than the portion of the transfer film 30 corresponding to the functional layers 20, the area of the functional layers 20 that are under stress may be minimized. The holes 40a of the support frame 40 may be uniformly distributed so that the functional layers 20 have uniform characteristics.

It has been described that the transfer film 30 is detached from the target substrate 50 after the support frame 40 is detached from the transfer film 30, but the embodiments are not limited thereto. For example, the transfer film 30 may be detached or removed from the target substrate 50 in a state where the functional layers 20, the transfer film 30, and the support frame 40 are located over the target substrate 50 as shown in FIG. 5, so that the support frame 40 may also be detached from the target substrate 50. As described above, the transfer film 30 may be removed using a common stripper. For example, the transfer film 30 including PMMA may be removed using acetone or chloroform. When the transfer film 30 is removed using such a liquid, the support frame 40 over the transfer film 30 may also be removed from the target substrate 50 together with the transfer film 30. In this case, since the support frame 40 has the holes 40a, the liquid may directly contact different regions of the transfer film 30. As a result, the transfer film 30 may be quickly removed and/or detached from the target substrate 50 through a procedure in which the transfer film 30 is at least partially dissolved.

Various electronic devices including large-scale single- or multi-layer thin film transistors may be manufactured using this method. The above-described transferring technique may also be used to manufacture optical elements or large-scale coating films and/or filtering films.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing an electronic device, the method comprising:
   locating a transfer film over a plurality of functional layers, the plurality of functional layers being separated from each other over a source substrate, the transfer film being transparent or translucent;
   attaching a support frame to the transfer film, the support frame having a plurality of holes spaced apart from each other to expose portions of a top surface of the transfer film through the plurality of holes;
   removing the source substrate from the transfer film, with the plurality of functional layers being in close contact with a bottom surface of the transfer film;
   aligning the plurality of functional layers with a target substrate and locating the transfer film over the target substrate, with the plurality of functional layers being in close contact with the bottom surface of the transfer film;
   detaching the support frame from the transfer film; and
   removing the transfer film from the target substrate.

2. The method of claim 1, wherein adhesiveness of the support frame varies with temperature.

3. The method of claim 2, wherein the detaching of the support frame comprises decreasing the adhesiveness of the support frame by increasing temperature.

4. The method of claim 2, wherein the detaching of the support frame further comprises decreasing the adhesiveness of the support frame by increasing temperature to 150° C. to 180° C.

5. The method of claim 1, wherein adhesiveness of the support frame is decreased when ultraviolet rays are radiated onto the support frame, and
   the detaching of the support frame further comprises decreasing the adhesiveness of the support frame by radiating the ultraviolet rays onto the support frame.

6. The method of claim 1, wherein an area of the support frame is larger than an area of the transfer film.

7. The method of claim 1, wherein the support frame has the plurality of holes throughout an area wider than a portion of the transfer film corresponding to the plurality of functional layers.

8. The method of claim 1, wherein the plurality of holes of the support frame are uniformly distributed.

9. The method of claim 1, wherein the plurality of functional layers comprise:
   a one-dimensional micro-material layer or a one-dimensional nano-material layer having a tube shape, a wire shape, or a bar shape; or
   a two-dimensional micro-material layer or a two-dimensional nano-material layer including one among graphene, transition metal dichalcogenide, hexagonal boron nitride, and black phosphorus.

10. The method of claim 1, wherein the transfer film comprises a material selected from the group consisting of polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), poly(vinyl acetate) (PVAc), silica-gel, and polyurethane acrylate (PUA).

11. A method of manufacturing an electronic device, the method comprising:
   locating a transfer film over a plurality of functional layers separated from each other over a source substrate, the transfer film being transparent or translucent;
   attaching a support frame to the transfer film, the support frame having a plurality of holes spaced apart from each other to expose portions of a top surface of the transfer film through the plurality of holes;
   removing the source substrate from the transfer film, with the plurality of functional layers being in close contact with a bottom surface of the transfer film;
   aligning the plurality of functional layers with a target substrate and locating the transfer film over the target substrate, with the plurality of functional layers being in close contact with the bottom surface of the transfer film; and
   detaching or removing the transfer film from the target substrate by applying stripping liquid onto the transfer film through the plurality of holes of the support frame so that the support frame is detached from the target substrate.

12. The method of claim 11, wherein an area of the support frame is larger than an area of the transfer film.

13. The method of claim 11, wherein the support frame has the plurality of holes throughout an area wider than a portion of the transfer film corresponding to the plurality of functional layers.

14. The method of claim 11, wherein the plurality of holes of the support frame is uniformly distributed.

15. The method of claim 11, wherein the plurality of functional layers comprises:
   a one-dimensional micro-material layer or a one-dimensional nano-material layer having a tube shape, a wire shape, or a bar shape; or
   a two-dimensional micro-material layer or a two-dimensional nano-material layer including one among graphene, transition metal dichalcogenide, hexagonal boron nitride, and black phosphorus.

16. The method of claim 11, wherein the transfer film comprises a material selected from the group consisting of polydimethylsiloxane (PDMS), CYTOP, polymethylmethacrylate (PMMA), ethyl lactate, polycarbonate (PC), poly propylene carbonate (PPC), polyimide (PI), para-aramid fibrid, polyethylene terephthalate (PET), polyvinyl chloride (PVC), poly(vinyl acetate) (PVAc), silica-gel, and polyurethane acrylate (PUA).

* * * * *